United States Patent
Rinerson et al.

(10) Patent No.: US 7,071,008 B2
(45) Date of Patent: Jul. 4, 2006

(54) MULTI-RESISTIVE STATE MATERIAL THAT USES DOPANTS

(75) Inventors: Darrell Rinerson, Cupertino, CA (US); Wayne Kinney, Emmett, ID (US); Christophe J. Chevallier, Palo Alto, CA (US); Steven W. Longcor, Mountain View, CA (US); Edmond R. Ward, Monte Sereno, CA (US); Steve Kuo-Ren Hsia, San Jose, CA (US)

(73) Assignee: Unity Semiconductor Corporation

( * ) Notice: Subject to any disclaimer, the term of this patent is extended or adjusted under 35 U.S.C. 154(b) by 129 days.

(21) Appl. No.: 10/604,606

(22) Filed: Aug. 4, 2003

(65) Prior Publication Data

US 2004/0161888 A1    Aug. 19, 2004

Related U.S. Application Data

(63) Continuation-in-part of application No. 10/330,512, filed on Dec. 26, 2002, now Pat. No. 6,753,561.

(60) Provisional application No. 60/424,083, filed on Nov. 5, 2002, provisional application No. 60/422,922, filed on Oct. 31, 2002, provisional application No. 60/400,849, filed on Aug. 2, 2002.

(51) Int. Cl.
*H01L 21/00* (2006.01)
*H01L 21/20* (2006.01)

(52) U.S. Cl. .............................. 438/3; 438/54; 438/385

(58) Field of Classification Search .................... 438/3, 438/54, 169, 210, 240, 384, 385, 571, 57
See application file for complete search history.

(56) References Cited

U.S. PATENT DOCUMENTS 6,204,139 B1    3/2001   Liu et al.

OTHER PUBLICATIONS

Basun, S. A. et al., "*Photoinduced Phenomena in $Sr_{1-x}CA_xTiO_2$, $0 \leq x \leq 0.12$*", Ferroelectrics, vol. 183, 1996,255-264.

Beck, A. et al., "*Reproducible switching effect in thin oxide films for memory applications*", Applied Physics Letters, vol. 77, No. 1, Jul. 3, 2000,139-141.

(Continued)

*Primary Examiner*—David S. Blum

(57) ABSTRACT

A multi-resistive state material that uses dopants is provided. A multi-resistive state material can be used in a memory cell to store information. However, a multi-resistive state material may not have electrical properties that are appropriate for a memory device. Intentionally doping a multi-resistive state material to modify the electrical properties can, therefore, be desirable.

22 Claims, 8 Drawing Sheets

OTHER PUBLICATIONS

Gerstner E.G. et al., *Nonvolatile memory effects in nitrogen doped tetrahedral amorphous carbon thin films*, Journal of Applied Physics, vol. 84, No. 10, Nov. 15, 1998, 5647-5651.

Koidl, P. et al., *"Photochromism in Ni-doped $SrTiO_3$"*, Physical Review B, vol. 14, No. 7, Oct. 1, 1976, 2703-2708.

Rossel, C. et al., *"Electrical current distribution across a metal-insulator-metal structure during bistable switching"*, Journal of Applied Physics, vol. 90, No. 6, Sep. 15, 2001, 2892-2898.

Watanabe, Y. et al., *"Current-driven insulator-conductor transition and nonvolatile memory in chromium-doped $SrTiO_3$ single crystals"*, Applied Physics Letters, vol. 78, No. 23, Jun. 4, 2001, 3738-3740.

Liu, S.Q., et al., *"Electric-pulse-induced reversible resistance change effect in magnetoresistive films"*, Applied Physics Letters, vol. 76, No. 19, May 8, 2000, 2749-2651.

Liu, S.Q., et al., *"A New Concept For Non-Volatile Memory: Electric-Pulse Induced Reversible Resistance Change Effect In Magnetoresistive Films"*, Space Vacuum Epitaxy Center, University of Huston, Huston TX, 7 Pages.

MULTI-RESISTIVE STATE MATERIAL THAT USES DOPANTS

CROSS REFERENCE TO RELATED APPLICATIONS

This application is a continuation-in-part of U.S. patent application Ser. No. 10/330,512, filed Dec. 26, 2002 now U.S. Pat. No. 6,753,561, which claims the benefit of U.S. Provisional Application No. 60/400,849, filed Aug. 2, 2002, U.S. Provisional Application No. 60/422,922, filed Oct. 31, 2002, and U.S. Provisional Application 60/424,083, filed Nov. 5, 2002, all of which are incorporated herein by reference in their entireties and for all purposes. This application is related to the following U.S. patent applications: application Ser. No. 10/360,005, filed Feb. 7, 2003; application Ser. No. 10/330,153, filed Dec. 26, 2002; application Ser. No. 10/330,964, filed Dec. 26, 2002; application Ser. No. 10/330,170, filed Dec. 26, 2002; application Ser. No. 10/330,900, filed Dec. 26, 2002; application Ser. No. 10/330,150, filed Dec. 26, 2002; application Ser. No. 10/330,965, filed Dec. 26, 2002; application Ser. No. 10/249,846, filed May 12, 2003; application Ser. No. 10/249,848, filed May 12, 2003; application Ser. No. 10/612,733, filed Jul. 1, 2003; application Ser. No. 10/613,099, filed Jul. 1, 2003; application Ser. No. 10/612,191, filed Jul. 1, 2003; application Ser. No. 10/612,263, filed Jul. 1, 2003; and application Ser. No. 10/612,776, filed Jul. 1, 2003. All of the above applications are hereby incorporated herein by reference in their entireties and for all purposes.

BACKGROUND OF INVENTION

1. Field of the Invention

The present invention relates generally to computer memory, and more specifically to materials that can be used as a memory element.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be generated from two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and non-volatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF INVENTION

The present invention provides a memory with an array of memory cells and selection circuitry that is capable of selecting a single memory cell or a group of memory cells out of the array of memory cells. Each memory cell includes a memory element that exhibits a hysteresis that is characterized by a first write threshold when the memory element is in a low resistive state and a second write threshold when the memory element is in a high resistive state. Furthermore, voltages applied across the memory element that are higher than the first write threshold have substantially no effect on the resistive state of the memory element when the memory element is in the low resistive state and voltages applied across the memory element that are lower than the second write threshold voltage have substantially no effect on the resistive state of the memory element when the memory element is in the high resistive state. Additionally, the structure of the memory element is intentionally modified.

In some aspects of the invention, the structure of the memory element is intentionally modified by substituting a crystalline element with a dopant. In other aspects of the invention, the structure of the memory element is intentionally modified by interstitially introducing a dopant into a crystalline structure.

In another aspect of the invention, a method for modifying electrical properties of a multi-resistive state material is provided. A multi-resistive state material is doped to modify at least one electrical property of the multi-resistive state material. The multi-resistive state material is additionally supplied between a pair of electrodes. Finally, at least one electrical pulse is applied to the pair of electrodes, the electrical pulse having a selected polarity, a selected width, a selected maximum value and a selected waveform so as to create an electric field in the multi-resistive state material greater than a threshold electric field value to reversibly change the resistivity of the multi-resistive state material, the pulse having a pulse energy less than a pulse energy required to damage the multi-resistive state material.

In some aspects of the invention, doping the multi-resistive state material modifies its resistivity, amount of charge traps, magnitude of the difference from the high resistive state to the low resistive state, temperature sensitivity, and/or magnetic field dependence.

In other aspects of the invention, the interface between the electrodes and the multi-resistive state material causes an ohmic effect. In yet other aspects of the invention, the interface between the electrodes and the multi-resistive state material causes a Schottky effect.

BRIEF DESCRIPTION OF DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs. are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Overview

Immobilized current carriers can act to change the electrical properties of a material. A current carrier can be either a negatively charged electron or a positively charged hole. The current carrier trap locations ("traps") are regions within the material that immobilize current carriers and cause localized energy levels within its bandgap.

If the material is a multi-resistive state material that is capable of changing its resistivity according to external stimuli, then the resistive state of the material can represent the stored data in the memory cell. However, an unaltered memory material may not have enough naturally occurring traps to be useful.

To foster the creation of traps, extrinsic materials, called dopants, can be introduced into the memory material in minute quantities. Some dopants create trapping centers at deep energy levels within the bandgap. Typically, the dopant would make up less than 10% molecular percentage of the total material.

The Memory Array

Conventional nonvolatile memory requires three terminal MOSFET-based devices. The layout of such devices is not ideal, usually requiring feature sizes of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized.

Figure 1:
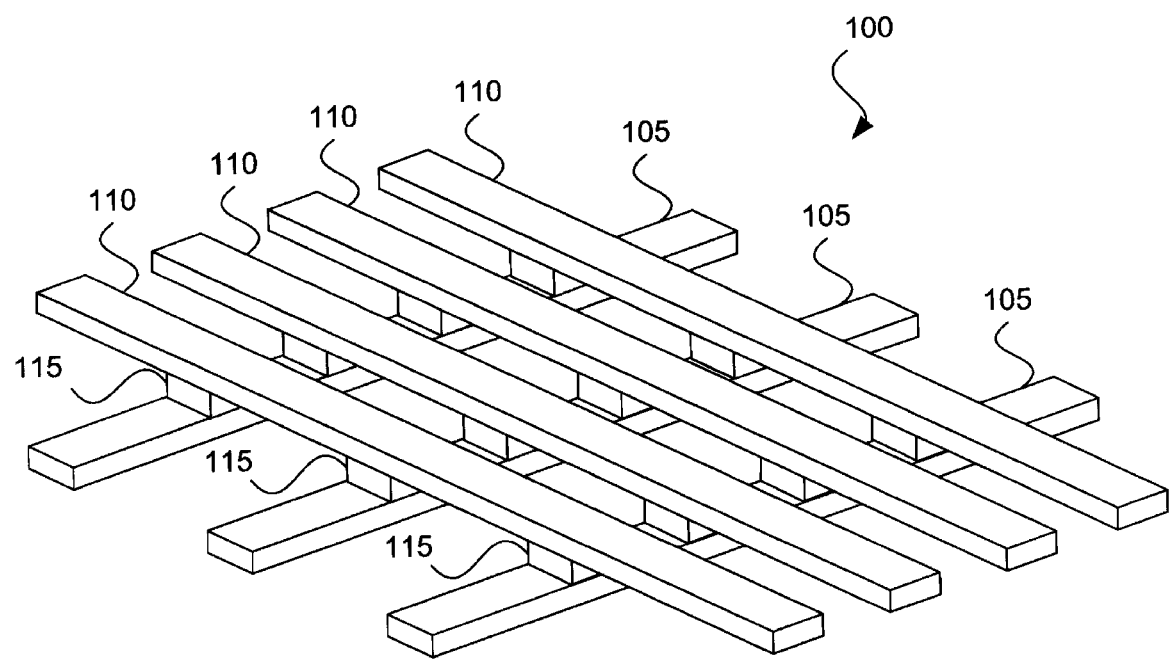
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2:
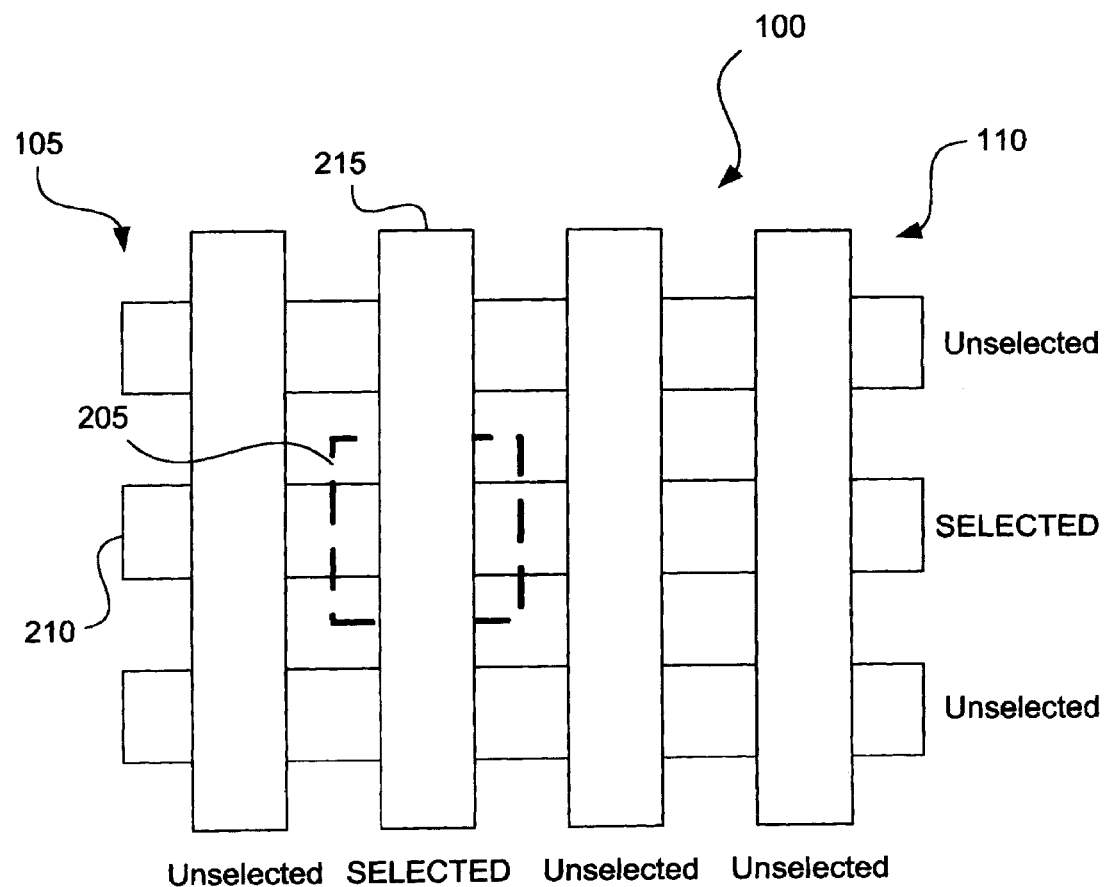
FIG. 2 depicts a plan view of selection of a memory cell in the cross point array depicted in FIG. 1.
Figure 3:
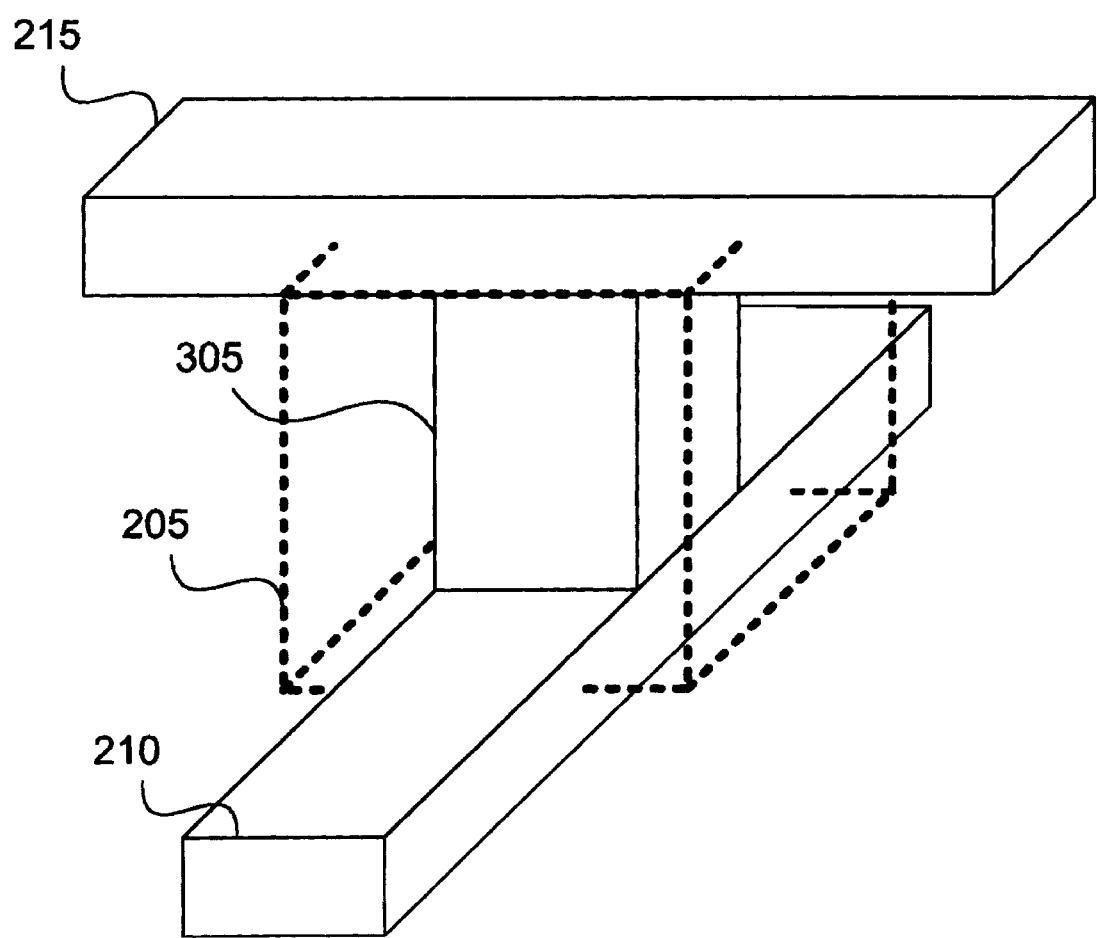
FIG. 3 depicts a perspective view of the boundaries of the selected memory cell depicted in FIG. 2.

FIG. 2 illustrates selection of a memory cell 205 in the cross point array 100. The point of intersection between a single x-direction conductive array line 210 and a single y-direction conductive array line 215 uniquely identifies the single memory cell 205. FIG. 3 illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 4:
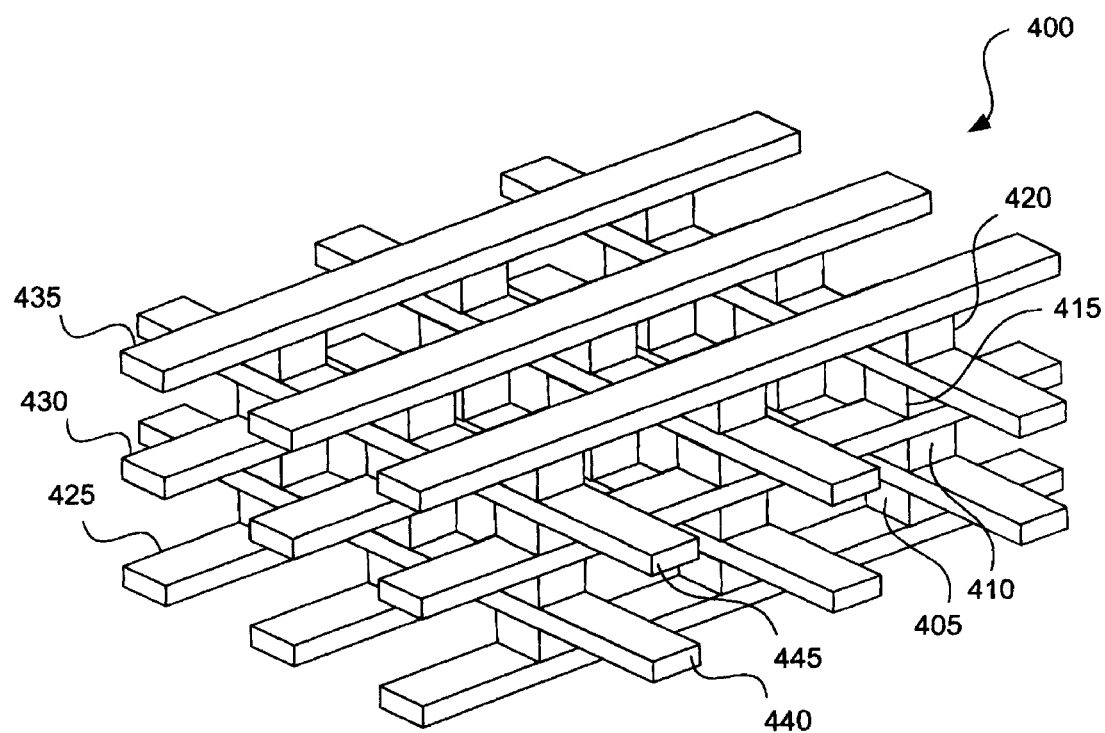
FIG. 4 depicts a perspective view of an exemplary stacked cross point memory array employing four layer of memory.

FIG. 4 depicts an exemplary stacked cross point array 400 employing four memory layers 405, 410, 415, and 420. The memory layers are sandwiched between alternating layers of x-direction conductive array lines 425, 430 and 435 and y-direction conductive array lines 440 and 445 such that each memory layer 405, 410, 415, and 420 is associated with only one x-direction conductive array line layer and one y-direction conductive array line layer. Although the top conductive array line layers 435 and bottom conductive array line layer 425 are only used to supply voltage to a single memory layer 405 and 420, the other conductive array line layers 430, 440, and 445 can be used to supply voltage to both a top and a bottom memory layer 405, 410, 415, or 420.

Referring back to FIG. 2, the repeatable cell that makes up the cross point array 100 of memory cells 315 can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be fabricated to the same width, regardless of whether both surfaces of the conductive array line was used. Accordingly, the very top and very bottom layers of conductive array lines (which use only one surface) would typically be fabricated to the same size as all other layers of conductive array lines.

Generally, the benefit of the cross point array is that the active circuitry that drives the cross point array 100 or 400 can be placed beneath the cross point array, therefore reducing the footprint required on a semiconductor substrate. Co-pending U.S. patent application, "Layout Of Driver Sets In A Cross Point Memory Array," U.S. application Ser. No. 10/612,733, filed Jul. 1, 2003, already incorporated by reference, describes various circuitry that can achieve a small footprint underneath both a single layer cross point array 100 and a stacked cross point array 400.

Figure 5:
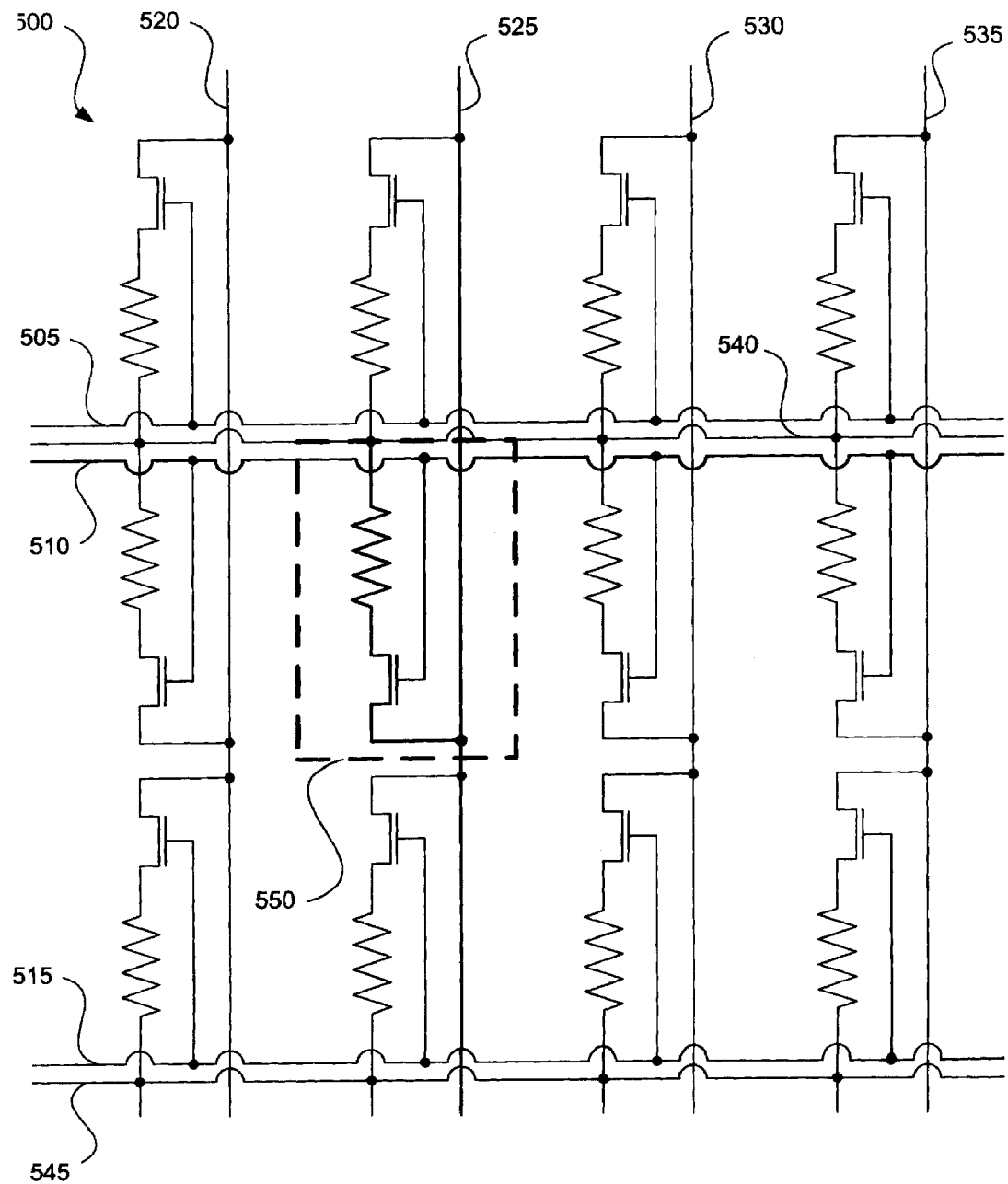
FIG. 5 depicts a schematic diagram of selection of a memory cell in a transistor memory array.

The cross point array is not the only type of memory array that can be used with a two-terminal memory element. FIG. 5 is a schematic representation of an array 500 of memory cells laid out in a two-dimensional transistor memory array 500. Each memory cell in the transistor memory array 500 is connected to one select line 505, 510, or 515, one data line 520, 525, 530, or 535, and a reference line 540 or 545. In one embodiment, all reference lines 540 and 545 are held to the same voltage, and perhaps even tied together. Therefore, a single select line 510 and a single data line 525 uniquely define an individual memory cell 550.

By connecting the select lines 505, 510, and 515 to the gates of field effect transistors (FETs), the select lines 505, 510, and 515 can control whether current from the data lines 520, 525, 530, and 535 are able to pass to the memory plugs. The data lines 520, 525, 530, and 535 both carry the data from the memory cells during READ operations and provides the memory cells with a voltage pulse appropriate to change the resistive state of the memory plug during WRITE operations. Selection circuitry used to select a specific data line 520, 525, 530, or 535 would generally be placed outside the select transistor memory array 500.

Figure 6:
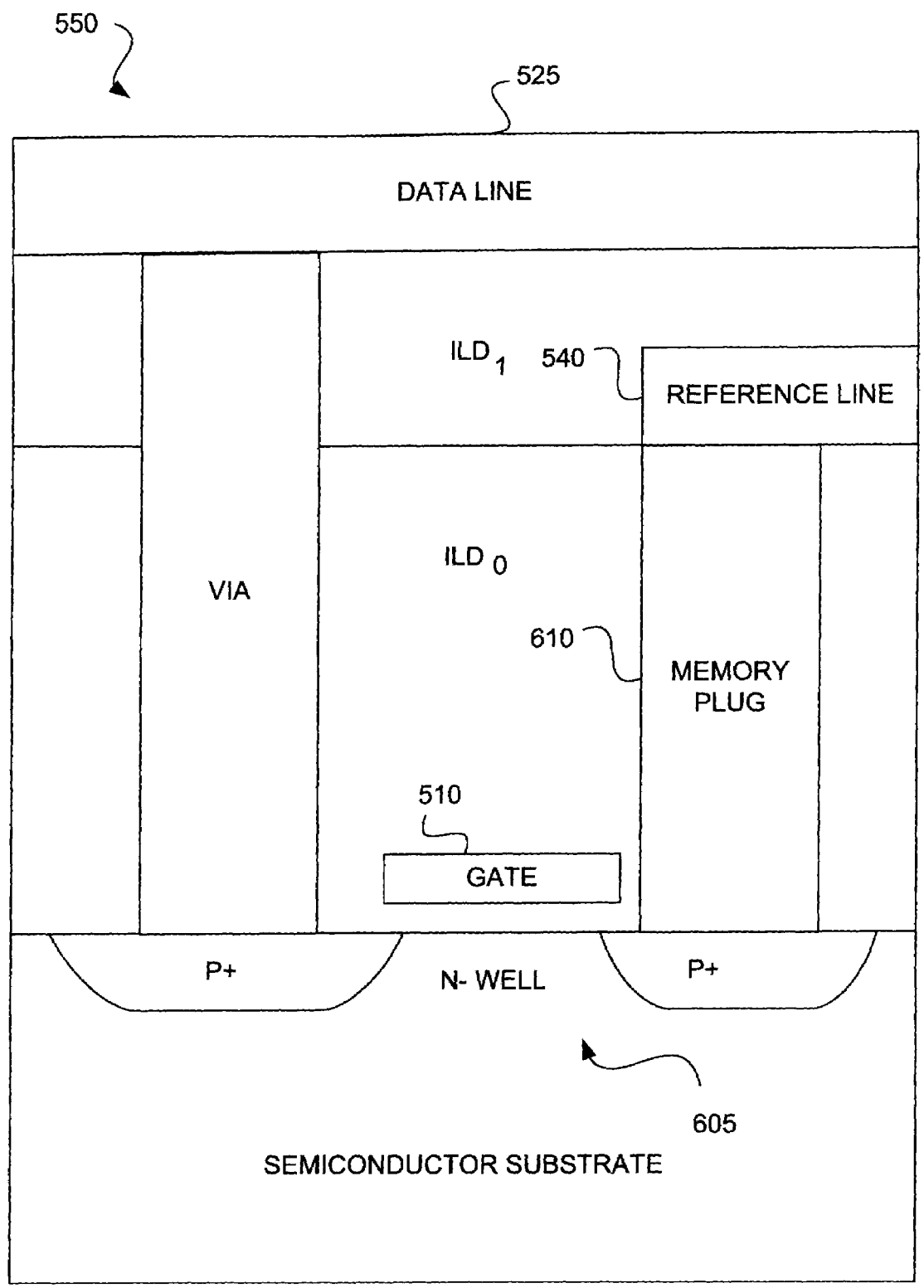
FIG. 6 depicts a cross section of the selected memory cell depicted in FIG. 5.

FIG. 6 is a diagrammatic representation of the memory cell 550 that can be used in a transistor memory array 500. Each memory cell 550 includes a transistor 605 and a memory plug 610. The transistor 605 is used to permit current from the data line 525 to access the memory plug 610 when an appropriate voltage is applied to the select line 510, which is also the transistor's gate. The reference line 540 might span two cells if the adjacent cells are laid out as the mirror images of each other. Co-pending U.S. patent application, "Non-Volatile Memory with a Single Transistor and Resistive Memory Element," U.S. application Ser. No. 10/249,848, filed May 12, 2003, already incorporated by reference, describes the specific details of designing and fabricating a select transistor memory array.

The Memory Plug

Each memory plug 305 or 610 contains a memory element along with any other materials that may be desirable for fabrication or functionality. For example, the additional materials might include electrodes and a non-ohmic device, as is described in co-pending application "High Density NVRAM," U.S. application Ser. No. 10/360,005, filed Feb. 7, 2003, already incorporated by reference. The non-ohmic device exhibits a very high resistance regime for a certain range of voltages ($V_{NO-}$ to $V_{NO+}$) and a very low resistance regime for voltages above and below that range. Together, the memory element and the non-ohmic device cause the memory plug 305 or 610 to exhibit a non-linear resistive characteristic. While a non-ohmic device might be desirable in certain arrays, it may not be helpful in other arrays.

Figure 7:
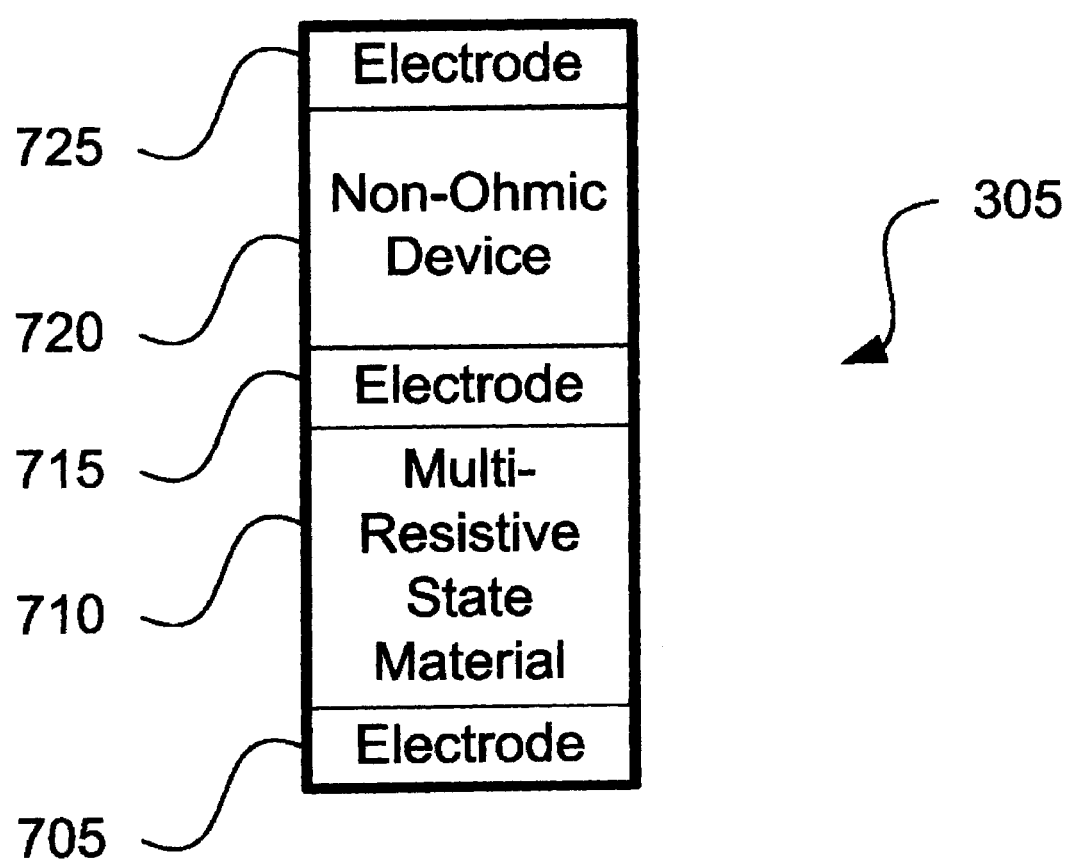
FIG. 7 depicts a side view of an exemplary memory plug with five layers.

FIG. 7 depicts a side view of an exemplary five-layer memory plug 305 with a non-ohmic device. The five layers are: a first electrode layer 705, a layer of multi-resistive state material 710, a second electrode layer 715, a layer making up the non-ohmic device 720, and a third electrode 725. Some layers may actually be made up of multiple thin films. For example, one type of non-ohmic device 720 uses a three film metal-insulator-metal (MIM) structure. Additionally, not all the layers are required for every memory plug 305 or 610 configuration. For example, certain cross point arrays may use means other than the non-ohmic device 720 to prevent unselected memory plugs from being disturbed.

The fabrication techniques used for the memory plug 305 or 610 will typically dictate the requirements of the layers beneath the memory plug (e.g., the select lines 505, 510, and 515 in the transistor memory array 500). Certain fabrication process (e.g., solution based spin on followed by high temperature anneal, pulsed laser deposition, sputtering, and metalorganic chemical vapor deposition) might require that refractory metals be used for these layers so that they may withstand the high temperature fabrication process. However, refractory metals have higher resistances, which may limit the number of cells on an array.

Typical electrodes 705, 715 and 725 commonly used in fabrication include Pt, Au, Ag and Al. If the only purpose of the electrodes 705, 715 and 725 is as a barrier to prevent metal inter-diffusion, then a thin layer of metal, e.g. TiN, could be used. If a seed layer is additionally required, any number of electrically conductive materials can be used on top of the thin layer of metal. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. It will be appreciated that the choice of electrode layers 705, 715 and 725 in combination with the multi-resistive state material layer 710 may affect the properties of the memory element.

The various properties of the multi-resistive state material 710 will determine both the lowest possible resistance state and the highest possible resistive state. Although the highest operational resistive state ($R_0$) of the memory plug 305 or 610 does not need to be its highest theoretical state and the lowest operational resistance state ($R_1$) does not need to be its lowest theoretical state, designs can set $R_0$ and $R_1$ close to those states for simplicity.

When considering an operating value of the $R_1$ resistive state, parasitic resistances that are in series with the memory plug must also be considered. Sources of resistance include the contacts and the vias, the metal interconnect lines, and the driver circuits. Parasitic resistances might total 100–200Ω, which puts a lower limit on the memory plug resistance. While the parasitic resistance may be overcome through more complicated circuit design, such designs typically result in loss of access time, or a larger die size.

The $R_1$ state of the memory plug may have an optimal value of 10 kΩ to 100 kΩ. If the $R_1$ state resistance is much less than 10 kΩ, the current consumption will be increased because the cell current is high, and the parasitic resistances will have a larger effect. If the $R_1$ state value is much above 100 kΩ, the RC delays will increase access time. However, workable single state resistive values may still be achieved with resistances as low as 5 kΩ and as high as 1 MΩ. Typically, a single state memory would have the operational voltages of $R_0$ and $R_1$ separated by a factor of 10.

For example, if 1 volt were used as a read voltage ($V_R$), $R_1$ might be about 100 kΩ and $R_0$ might be about 1 MΩ, making the current either 10 μA or 1 μA, depending on the resistive state. Since large currents can be destructive to semiconductors fabricated to small dimensions, no more than 10 μA would be desired for a memory circuit in most cases. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state material 710. Similarly, $V_W$ should be greater than $V_{Wth}$, the threshold at which the resistive material starts to change resistivity, for the same reason. A typical $V_W$ might be about 2 volts, and $V_{Wth}$ might be about 1.5 volts.

It should be noted that changes in the resistive property of the memory plugs that are greater than a factor of 10 might be desirable in multi-bit resistive memory cells that have more than two states. Generally, adjusting the pulse width and magnitude of the voltage pulses across the multi-resistive state material results in different resistive states. Since multi-resistive state material 710 can be placed into several different resistive states, multi-bit resistive memory cells are possible. For example, the multi-resistive state material might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 kΩ, the six intermediary states might have resistive states of about 26.8 kΩ, 72.0 kΩ, 193 kΩ, 518 kΩ, 1.39 MΩ, and 3.73 MΩ. The highest resistive state would then be 10 MΩ, 1000 times the value of the low resistive state. Each optimal resistive state could be calculated by using the relationship $\text{Log}(R_{110})=\text{Log}(R_{111})+\text{Log } K$; $\text{Log}(R_{101})=\text{Log}(R_{111})+2 \text{ Log } K$; $\text{Log}(R_{100})=\text{Log}(R_{111})+3 \text{ Log } K$; ... $\text{Log}(R_{000})=\text{Log}(R_{111})+7 \text{ Log } K$, where $\text{Log } K=(1/7)[\text{Log}(R_{000})-\text{Log}(R_{111})]$.

Ideally, the multi-resistive state material 710 should switch very quickly from one resistive state to another. Typically, anything less than 50 nanoseconds would be an appropriate switching speed for applications such as mobile phones, PDAs or other portable electronics devices. Additionally, once the multi-resistive state material 710 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state material 710.

The Multi-Resistive State Material

Figure 8A:
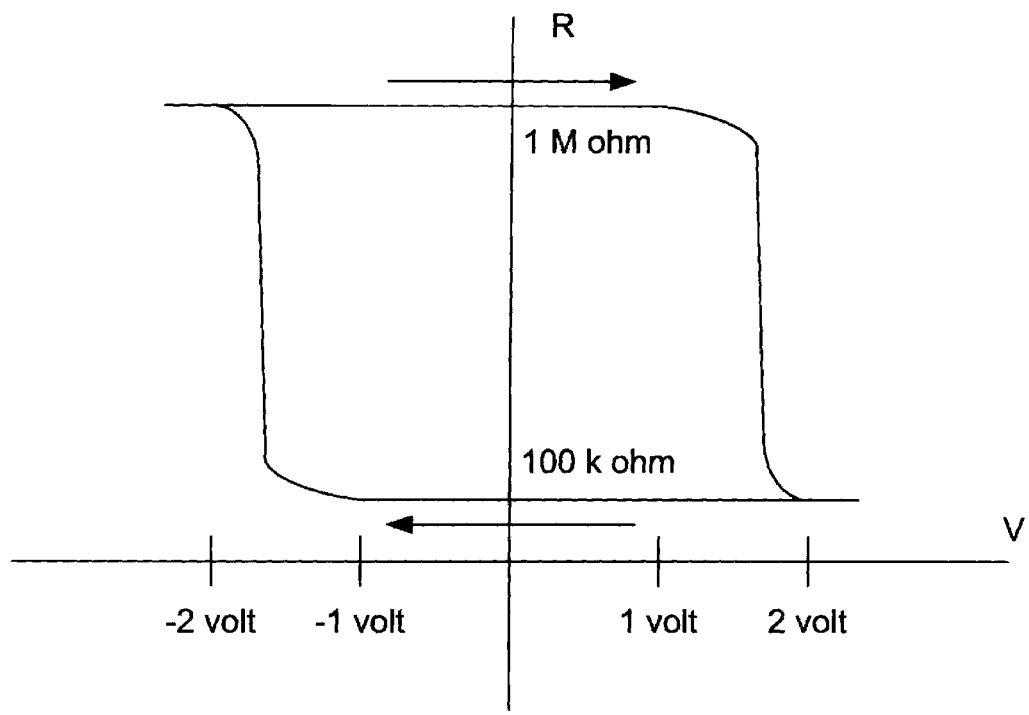
FIG. 8A depicts a graph illustrating exemplary RV characteristics of a memory element initially biased in one direction.

Importantly, the multi-resistive state material 710 should have a hysteresis that allows non-destructive reads. As shown in FIG. 8A any voltages between $-V_R$ (depicted as −1 volt) and $+V_R$ (depicted as 1 volt) will have no effect on the resistive state of the memory element (i.e., it will remain at either 100 kΩ or 1 MΩ). Therefore, a WRITE operation is not necessary after a READ operation for such materials.

The hysteresis shown in FIG. 8A has two write threshold voltages, one for when the multi-resistive state material 710 is in the low resistive state $R_1$ and one for when the multi-resistive state material 710 is in the high resistive state $R_0$. In the low resistive state $R_1$, the first write threshold voltage $-V_{Wth}$ is the point above which any voltages applied across the multi-resistive state material 710 have substantially no effect on the resistive state of the multi-resistive state material 710 and below which a voltage pulse will alter the resistance of the multi-resistive state material 710. Similarly, in the high resistive state $R_0$, the second write threshold voltage $+V_{Wth}$ is the point below which any voltages applied across the multi-resistive state material 710 have substantially no effect on the resistive state of the multi-resistive state material 710 and above which a voltage pulse will alter the resistance of the multi-resistive state material 710.

When initially fabricated, the multi-resistive state material 710 may be in a high resistive state $R_0$. The multi-resistive state material 710 then transitions from its high resistive state $R_0$ to a low resistive state $R_1$ in response to a voltage pulse. Whether the bottom terminal is at +3V and the top terminal is at −3V in order to lower the resistive sate or vice-versa depends upon the specific properties of the material that is used. FIG. 8A is an example of the multi-resistive state material 710 that requires a +2V pulse to lower its resistive state and FIG. 8B, a mirror image of FIG. 8A, is an example of the multi-resistive state material 710 that requires a −2V pulse to lower its resistive state.

Generally, the chemical and materials properties of the multi-resistive state material 710 are selected to meet the electrical specifications set forth above. For example, the material preferably has a resistivity of between about 0.1Ω-cm to 1Ω-cm (although workable values may be as high as 5Ω-cm and the multi-resistive state material may be able to achieve a much lower resistivity), exhibits a change in resistance of at least about 10×, and has this resistance change triggered by the application of a voltage pulse of not longer than about 100 ns duration and not greater than about 10V in magnitude. In addition, the memory element material should be compatible with the requirements imposed by the general fabrication process of the entire high density RAM.

The multi-resistive state material 710 will generally, but not necessarily, be crystalline, either as a single crystalline structure or a polycrystalline structure. One class of multi-resistive state material 710 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state material 710 for use in the memory plug 305 or 610. The compounds that make up the perovskite class of multi-resistive state materials 710 include both normal conductive metal oxides and conductive complex metal oxides.

Figure 8B:
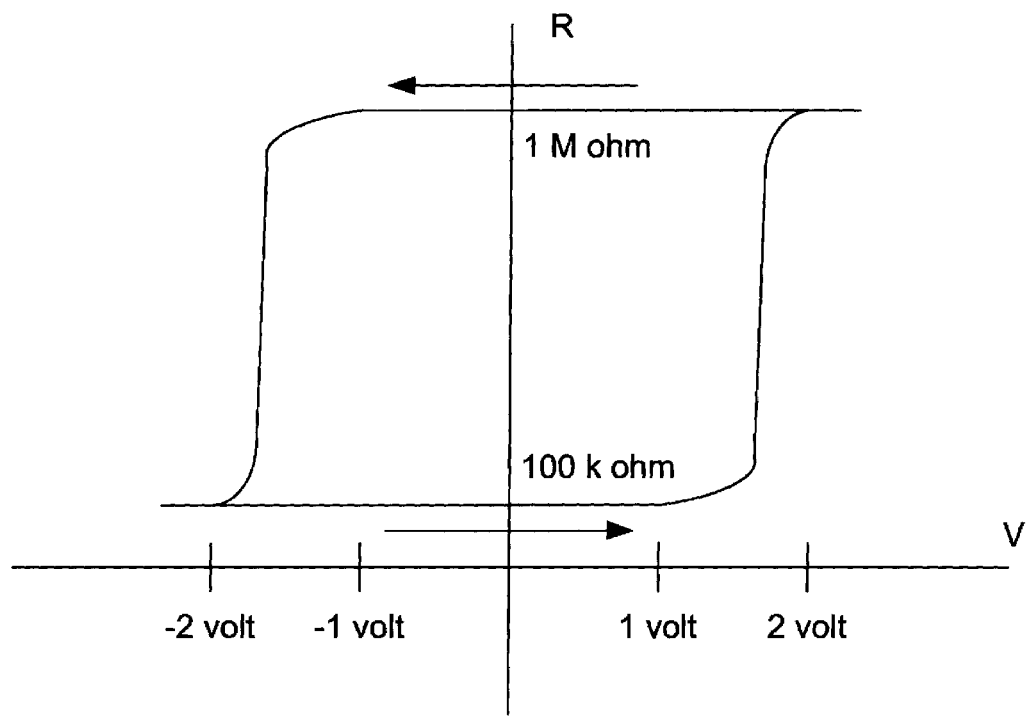
FIG. 8B depicts a graph illustrating exemplary RV characteristics of a memory element initially biased in a direction opposite to the memory element of FIG. 8A.

Multi-resistive state materials 710, however, are not limited to perovskites. Specifically, any material that has a hysteresis effect similar to what is shown in FIG. 8A or 8B could be used in the memory plug 305 or 610. Typically, trapped charges are the mechanism by which the hysteresis effect is created.

Some examples of amorphous materials exhibiting such hysteresis include SiO, as described in "New conduction and reversible memory phenomena in thin insulating films" by J. G. Simmons and R. R. Verderber, Proc. Roy. Soc. A. 301, 1967 pp. 77–102, hereby incorporated by reference for all purposes. Another example is carbon doped with nitrogen, as described in "Nonvolatile memory effects in nitrogen doped tetrahedral amorphous carbon thin films" by E. G. Gerstner and D. R. McKenzie, Journal of Applied Physics, Vol. 84, Num. 10, Nov. 1998, pp. 5647–5651, hereby incorporated by reference for all purposes.

Several different mechanisms might cause a material to have trapped charges. For example, strontium titanate (STO) or strontium zirconate (SZO) can be doped by adding an element that has a different preferred oxidation state (a different charge when ionized) when it replaces an element in the crystal matrix. Typically, the dopant would make up less than 10% molecular percentage of the total material. In SZO, chromium (Cr), with a +3 oxidation state, can replace zirconium (Zr) with a +4 oxidation state. Charge imbalance is compensated by either creation of appropriate vacancies (e.g., oxygen vacancies), by change of valence on a matrix element, or by introduction of free carriers (electrons or holes).

A dopant atom usually substitutes for a matrix element based, at least partly, on the similarity of ionic radii. Thus lanthanum (La) primarily substitutes for strontium (Sr) whereas Cr primarily substitutes for Zr in SZO. In SZO, cation vacancies are rare (i.e., there are few Sr and Zr vacancies), but anion vacancies (i.e., oxygen) are common. Therefore, adding Cr to SZO generates both oxygen vacancies and free holes. However, Cr addition is completely compensated by oxygen vacancies (one vacancy for every 2 Cr atoms) such that the material remains essentially insulating.

In contrast, free electrons primarily compensate for La in SZO. Therefore adding La drastically lowers the resistance of SZO. Similarly tantalum (Ta) or niobium (Nb) can substitute for Zr to lower SZO resistivity.

Further, vacancies (either anion or cation) can also act to create charge traps. The charge imbalance caused by a vacancy can be compensated by the same mechanisms that compensate for the intentional additions of a dopant. Thus, an oxygen vacancy compensated by 2 Cr atoms provides no free carriers, but if there is insufficient Cr for full compensation, oxygen vacancies lead to free electrons.

Some dopants create centers at deep levels in the bandgap. Such dopants create centers where a charge would need a high level of energy to exit that level, effectively creating traps with the deep levels. For example, Cr, iron (Fe), or nickel (Ni) can create traps in STO and SZO. To the contrary, yttrium (Y), La, Nb and Ta would create centers at shallow levels, which would not be traps. Some of these effects are described in "Photochromism in Ni-doped SrTiO3 P," Physical Review by the American Physical Society, 1 Oct. 1976, p. 2703, by Koidl et al., hereby incorporated by reference for all purposes.

The electrical properties of the multi-resistive state material 710 can be modified by, for example, doping the material with one or more dopants. These electrical properties include, but are not limited to, the resistivity of the material as well as the temperature sensitivity of such resistance; the amount or magnitude of charge trap; and magnetic field dependence. If more than one dopant is used, the dopants may serve to modify the same or different properties of the multi-resistive state material 710. In another aspect, doping the multi-resistive state material 710 causes the its electrical properties to be more uniform, whereby the electrical properties of the multi-resistive state material 710 have a greater predictability.

In a particular aspect, doping alters the resistivity of the material. For example, application of an electrical pulse reversibly changes the resistivity of the multi-resistive state material 710 from either a high value to a low value or from a low value to a high value; and doping the multi-resistive state material 710 modifies the magnitude of the difference from the high value to the low value.

In one aspect, the interface between the electrodes and the multi-resistive state material 710 may cause an ohmic effect (or electric potential drop by application of Ohm's law). In another aspect, the interface between the electrodes and the multi-resistive state material 710 causes a Schottky effect (or the emission of electrons due to the lowering of the potential barrier at the interface at high electric field) or pseudo-Schottky effect. Altering the amount or material of the doping can modify the magnitude of these effects.

In yet another aspect, doping the multi-resistive state material 710 additionally reduces the temperature sensitivity of its resistance.

In another aspect, doping alters the amount or magnitude of charge traps or otherwise modifies the ability of the charge traps to capture electrons and thus, improve the data retention capability of the multi-resistive state material 710. In other words, the doping should not facilitate electrons from tunneling through the multi-resistive state material 710 and leaving the charge trap during the operation of the memory.

In a further aspect, doping the multi-resistive state material 710 reduces magnetic field dependence.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A method of modifying electrical properties of a two-terminal memory element in a cross point memory array, comprising:

providing a substrate with active circuitry and multiple layers of conductive paths;

supplying a plurality of two-terminal memory elements between pairs of conductive array lines in a cross point array directly over the substrate, each two-terminal memory element comprising a praseodymium (Pr), calcium (Ca), manganese (Mn), and oxygen (O) perovskite as a multi-resistive state material;

doping the multi-resistive state material to modify at least one electrical property of the multi-resistive state material; and applying at least one electrical pulse to the pair of conductive array lines, the electrical pulse having a selected polarity, a selected width, a selected maximum value and a selected waveform so as to create an electric field in the multi-resistive state material greater than a threshold electric field value to reversibly change the resistivity of the multi-resistive state material, the pulse having a pulse energy less than a pulse energy required to damage the multi-resistive state material.

2. The method of claim 1, wherein:

doping the multi-resistive state material modifies resistivity.

3. The method of claim 2, wherein:

the electrical pulse reversibly changes the resistivity of the multi-resistive state material to a value between 0.1 $\Omega$-cm and 1.0 $\Omega$-cm.

4. The method of claim 1, wherein:
doping the multi-resistive state material modifies the amount of charge traps.

5. The method of claim 1, wherein:
doping the multi-resistive state materials improves the data retention capability of the multi-resistive state material.

6. The method of claim 1, wherein:
an interface between the pair of conductive array lines and the multi-resistive state material causes an ohmic effect.

7. The method of claim 1, wherein:
an interface between the pair of conductive array lines and the multi-resistive state material causes a Schottky effect.

8. The method of claim 1, wherein:
the electrical pulse reversibly changes the resistivity of the multi-resistive state material from either a high value to a low value or from a low value to a high value; and
doping the multi-resistive state material modifies the magnitude of the difference from the high value to the low value.

9. The method of claim 8, wherein:
an interface between the pair of conductive array lines and the multi-resistive state material causes an ohmic effect.

10. The method of claim 8, wherein:
an interface between the pair of conductive array lines and the multi-resistive state material causes a Schottky effect.

11. The method of claim 1, wherein:
the electrical pulse reversibly changes the resistivity of the multi-resistive state material to a value between 0.1 Ω-cm and 1.0 Ω-cm.

12. The method of claim 1, wherein:
doping the multi-resistive state material causes the multi-resistive state material's electrical properties to be more uniform, whereby the electrical properties of the multi-resistive state material have a greater predictability.

13. The method of claim 1, wherein:
doping the multi-resistive state material additionally reduces the temperature sensitivity of the multi-resistive state material's resistance.

14. The method of claim 4, wherein:
an interface between the pair of conductive array lines and the multi-resistive state material causes an ohmic effect.

15. The method of claim 4, wherein:
an interface between the pair of conductive array lines and the multi-resistive state material causes a Schottky effect.

16. The method of claim 1, wherein:
doping the multi-resistive state material reduces magnetic field dependence.

17. The method of claim 1, wherein:
the selected waveform is either a square, saw-toothed, triangular, sine wave, or some combination thereof.

18. The method of claim 1, wherein:
the selected maximum value of the selected waveform is between 1 volt and 15 volts.

19. The method of claim 1, wherein:
the selected waveform has a duration between 1 nanosecond and 100 microseconds.

20. The method of claim 1, wherein:
at least two electrical pulses are applied to the multi-resistive state material in order to reversibly change its resistivity.

21. The method of claim 1, wherein:
the electrical pulse reversibly changes the resistivity of the multi-resistive state material from either a high value to a low value or from a low value to a high value; and
once the multi-resistive state material's resistivity is changed, application of an opposite polarity second electrical pulse will cause the multi-resistive state material's resistivity to revert back to a low value if it was changed to high, or a high value if it was changed to low.

22. The method of claim 1, further comprising:
doping the multi-resistive state material with a second dopant to modify another electrical property of the multi-resistive state material.

* * * * *